United States Patent [19]

Mower

[11] Patent Number: 4,814,727
[45] Date of Patent: Mar. 21, 1989

[54] WIDE-DEVIATION TRACKING FILTER CIRCUIT

[75] Inventor: Vaughn L. Mower, Bountiful, Utah

[73] Assignee: Unisys Corporation, Blue Bell, Pa.

[21] Appl. No.: 135,166

[22] Filed: Dec. 18, 1987

[51] Int. Cl.$^4$ .............................................. H03L 7/06
[52] U.S. Cl. ........................................ 331/2; 331/18; 331/30; 331/48; 331/172
[58] Field of Search .................... 331/2, 10, 11, 12, 17, 331/18, 22, 23, 25, 30, 31, 48, 50, 55, 74, 77, 172, 173; 342/103, 159, 194, 199; 375/120; 333/173

[56] References Cited

U.S. PATENT DOCUMENTS

| 4,352,074 | 9/1982 | Blinchikoff et al. | 331/17 |
| 4,453,137 | 6/1984 | Rittenbach | 331/2 |

Primary Examiner—Eugene R. LaRoche
Assistant Examiner—David Mis
Attorney, Agent, or Firm—John B. Sowell; Kevin R. Peterson; Thomas J. Sbott

[57] ABSTRACT

A wide deviation tracking filter is provided which has the input signal to be tracked applied to a low frequency phase-locked loop circuit which performs coarse filtering of the phase noise on the input signal. A digital phase shifter is connected in series in the low frequency phase-locked loop and produces a pair of quadrature clock signals which are at the frequency of the input signal and at half the frequency of the output of the voltage control oscillator of the low frequency phase-locked loop. The pair of quadrature signals are connected to an image reject circuit. The image reject circuit is connected in series in the loop of a high frequency phase-locked loop which operates at a much higher frequency than the low frequency phase-locked loop and performs the function of further filtering the phase noise on the input signal to provide an output signal having ultra-low phase noise.

9 Claims, 3 Drawing Sheets

WIDE-DEVIATION TRACKING FILTER CIRCUIT

RELATED APPLICATIONS

This application is related to my co-pending application Serial No. 07/135,167, filed 18 Dec. 1987 (on the same date as the present application) and entitled "Image Reject Apparatus for Signal Synthesis Applications".

BACKGROUND OF THE INVENTION

1. Field of the Invention

This invention relates to a wide deviation phase-locked loop tracking filter circuit. More particularly, the present invention relates to a novel tracking filter circuit which provides an output signal having ultra-low phase noise.

2. Description of the Prior Art

Tracking filters were known heretofore and are employed to clean up input signals which are degraded by thermal noise and other types of interference signals. The prior art tracking filters employed a single phase-locked loop to produce the desired output signal. The prior art phase-locked loops were employed to track the slowly varying frequency of the input signal within the loop bandwidth of the phase-locked loop. For frequencies outside of the loop bandwidth, the phase noise of the output signal is identical to the noise of the free running loop oscillator. As the bandwidth of the input signal to the prior art tracking filters becomes wider the output signal phase noise increases.

Heretofore the output signal phase noise from wide deviation tracking filters would degrade as the frequency deviation of the phase-locked loop increased. The wider bandwidth causes the tracking filter to have a lower circuit Q at the loop oscillator which results in increased phase noise.

It would be desirable to provide a tracking filter circuit which is capable of providing output signals having ultra-low phase noise and a tracking filter circuit which does not increase phase noise degradation of the signal with increased input signal bandwidth.

SUMMARY OF THE INVENTION

It is a principal object of the present invention to provide an improved tracking filter for filtering wide deviation input signals in the presence of noise.

It is another principal object of the present invention to provide a novel tracking filter which can filter out noise from an input signal having a wide frequency range.

It is another principal object of the present invention to provide a tracking filter that does not appreciably degrade the output signal phase noise over a large bandwidth of input signals.

It is another object of the present invention to provide a novel tracking filter which linearly tracks the average phase of the input signal over a broad range of frequencies of the input signal.

It is another object of the present invention to provide in a tracking filter a novel phase-locked loop input which is operable as a coarse filter and as a clock generator for producing clock frequencies at the base input frequency and at twice the base input frequency with an exact predetermined phase relation.

Accordingly to these and other objects of the present invention, there is provided an input signal coupled to a low frequency phase-locked loop operated at twice the frequency of the base input signal and provides two output clock signals which have deterministic phase relative to the input signal. The clock outputs are coupled to an image reject circuit which is an integral part of a high frequency phase-locked loop. The low frequency phase-locked loop provides a coarse filtering of the noise on the input signal and the high frequency phase-locked loop provides an ultra fine filtering of the remaining noise on the input signal so that the output signal from the high frequency phase-locked loop is at the base frequency of the input signal and has an ultra-low phase noise degradation.

DESCRIPTION OF THE PREFERRED EMBODIMENT

Figure 1:
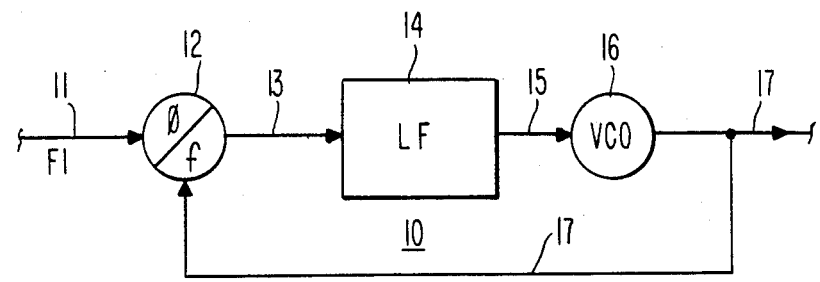
FIG. 1 is a block diagram showing a simplified prior art phase-locked loop tracking filter of the type employed to reduce phase noise.

Refer now to FIG. 1 showing a simplified prior art phase-locked loop of the type which can be coupled to an incoming noisy signal to produce a filtered and improved output signal. The noisy input signal on line 11 has a frequency F1 which is tracked in both frequency and phase by the phase-locked loop 10. The phase-frequency detector 12 compares the phase and frequency of the input signal on the line 11 with the phase and frequency of the signal on line 17. The output of the phase-frequency detector 12 produces an error signal on line 13 which is filtered by loop filter 14. The filtered output voltage signal on line 15 controls the frequency and phase of the voltage controlled oscillator (VCO) 16. The phase noise on the output signal on line 17 is approximately equal to the phase noise of the input signal on line 11 within the bandwidth of the loop 10. However, at frequencies outside the loop bandwidth, the phase noise in the output signal is equal to that of the free-running VCO 16. It will be noted that the signal on line 17 cannot be improved by adding a second phase-locked loop filter because the deviations of the second free-running VCO would be identical to the deviations of the first VCO in the first phase-locked loop 10.

Figure 2:
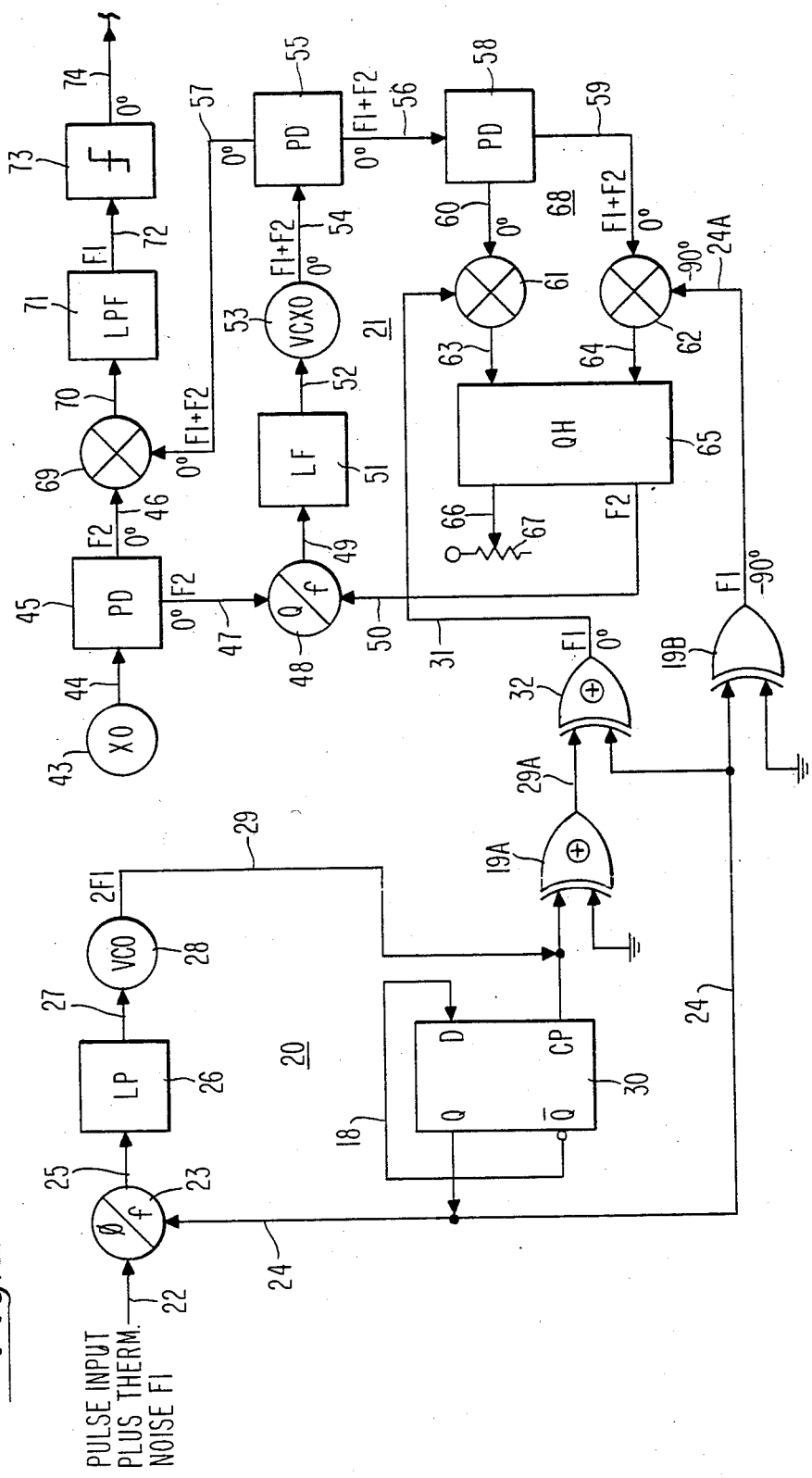
FIG. 2 is a block diagram showing the preferred embodiment of the present invention tracking filter.

Refer now to FIG. 2 showing a preferred embodiment of the present invention tracking filter. The present invention contains a first low frequency phase-locked loop 20 and a second high frequency phase-locked loop 21. The phase-locked loop 20 is a wide frequency deviation phase-locked loop and the phase-locked loop 21 is a narrow frequency deviation phase-locked loop. These phase-locked loops perform the function of coarse filtering and fine filtering as will be described hereinafter.

The input signal on line 22 to phase-locked loop 20 is typically a signal which will be received from a radar receiver. Such radar signals have one well defined edge which is corrupted with thermal noise and interference noise. As a result of the noise on the pulse edge, the phase noise of the input signal on line 22 is not well defined and may be improved by filtering in a tracking filter. In the preferred embodiment shown in FIG. 2, the input signal frequency at frequency F1 is in the range of 500 hertz to 2500 hertz which represents an input signal bandwidth ratio of 5 to 1. It will be assumed that the trailing edge of the input signal on line 11 is the aforementioned more stable edge upon which the phase-locked loop 20 will be operated and the explanation will employ this edge for the following explanation.

Figure 3:
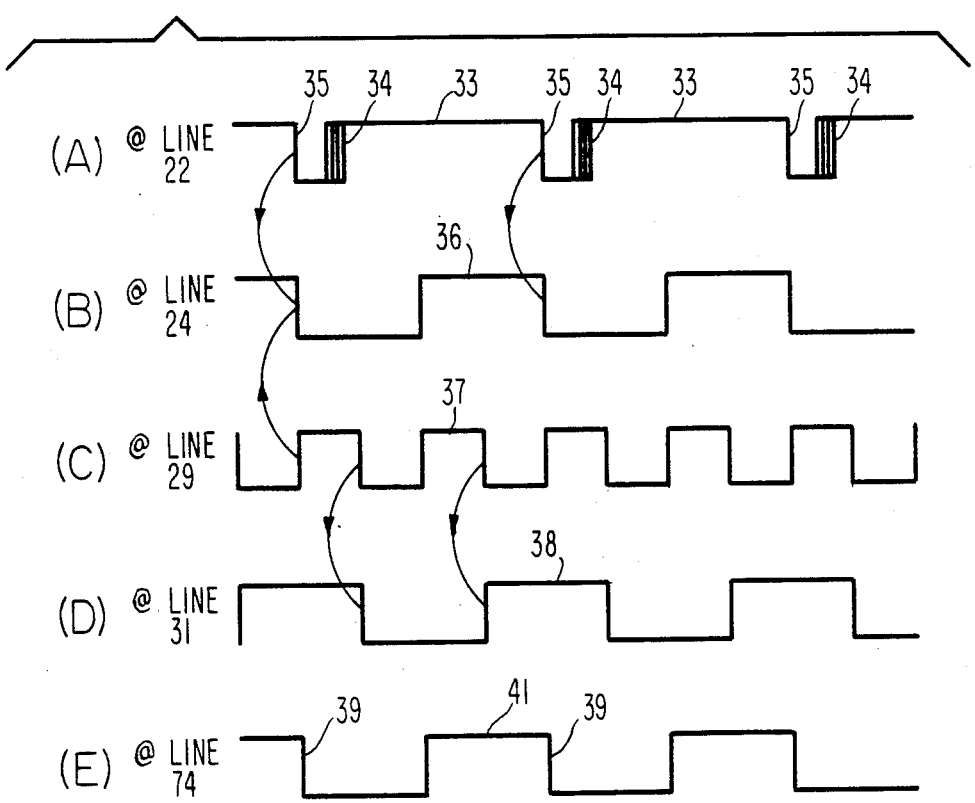
FIGS. 3A through 3E are waveforms showing the input waveform and the output waveform signals from the novel tracking filter of FIG. 2.

The trailing edge of the input signal on line 22 is compared in both frequency and phase with the signal on line 24 in the phase detector or comparator 23. The output of the phase comparator 23 on line 25 is filtered by loop filter 26 to provide a frequency error voltage on line 27 which is applied to voltage controlled oscillator (VCO) 28. The center frequency of VCO 28 is forced by the action of the phase-locked loop 20 to be at a frequency twice the input frequency on line 22 because of the D-type flip flop 30. Flip flop 30 is arranged to divide the frequency on line 29 by 2 and to provide the half frequency signal on line 24. The VCO 28 is designed to provide a square wave signal on line 29 which is at twice the input frequency or (2F1). The signal on line 29 at frequency 2F1 is applied to exclusive OR gate 32 via delay OR gate 19A and will be referred to in FIG. 3 hereinafter. The 2FI frequency on line 29A is exclusively ORed with the signal on line 24 to produce a 90-degree digital phase shifted signal on line 31. The signals on lines 24, 24A and lines 29, 31 are in precise quadrature shifted by 90° one from the other over the entire frequency range of the input signal stream. Thus, elements 20, 19A, 19B and 32 provide a digital phase shifter and the quadrature relationship of these two signals is an important feature for performing the correct operation of the high frequency phase-locked loop 21 as will be explained.

The function of low frequency phase-locked loop 20 and exclusive OR gate 32 is to provide two outputs on lines 31 and 24 which have the same frequency as the input signal on line 22 but which differ in exact phase by 90°.

Refer now to FIGS. 3A to 3E showing the input waveforms and the output signal produced from the high frequency phase-locked loop of the novel tracking filter. FIG. 3A shows the typical pulse signal 33 that has a leading edge 34 which is uncontrollable and has noise associated therewith. Whereas the trailing edge 35 of the pulses 33 has a clean pulse but has associated therewith phase noise caused by thermal noise and interference. FIG. 3B shows the pulse waveform which is produced by the D-type flip flop 30 at the real or Q output on line 24. This pulse is edge triggered from the trailing edge 35 by action of the phase-locked loop. FIG. 3C shows the square wave clock output at frequency 2F1 being produced by the voltage controlled oscillator 28 on line 29. It will be noted that the frequency of the clock on line 29 is at twice the frequency of the clock on line 24 and serves as the clock or trigger for the production of the waveform on line 24 shown as FIG. 3B. The pulses 36 on line 24 and the pulses 37 on line 29 are exclusively ORed in exclusive OR gate 32 to produce the pulses 38 shown in FIG. 3D which occur on line 31. It will be appreciated that the trailing edge 35 is exactly coincident with the trailing edge of pulses 36 and by virtue of the phase-locked loop pulses 36 and 38 are forced to be precise square waves that are 90° out of phase. FIG. 3E shows that the trailing edge 39 of pulse 41 which is being produced on output line 74 of the tracking filter is coincident with both the trailing edge 35 of the input waveform and the trailing edge of the clock pulse 36. While it is impossible to illustrate in the waveform FIGS. 3B and 3E, there is present on pulse 36 the aforementioned phase noise which is absent or reduced to a ultra-low figure of merit on pulses 41 at the output of the novel tracking filter.

The input signal to the high frequency phase-locked loop 21 of FIG. 2 is shown as a crystal oscillator 43 which operates as a fixed frequency F2 and is of the type which has a high circuit Q and low phase noise. Thus, in the preferred embodiment, the oscillator 43 is selected to be a crystal oscillator at a frequency at or near 10 megahertz. The frequency of 10 megahertz is selected because 10 megahertz is very much larger than the frequency of the F1 signal on input line 22 and also because such low noise crystal oscillators are readily available at this frequency. Further, in the preferred embodiment low noise crystal oscillator 43 and 53 are selected to have an impedance of 50 ohms. Accordingly, power dividers 45 and 55 are employed to maintain 50 ohm impedance through the system to the output.

The output of oscillator 43 on line 44 is power divided at power divider 45 to produce two outputs on lines 46 and 47 respectively. The signal on line 47 is identical in frequency to the F2 frequency of oscillator 43 and is the reference clock or reference frequency for the high frequency phase-locked loop 21. The reference signal on line 47 is compared with the phase of the signal on line 50 by phase detector or comparator 48. The phase detector 48 generates a voltage error signal on line 49 which is proportional to the phase difference between the signals on lines 47 and 50. Loop filter 51 filters the voltage error signal on line 49 to produce a frequency control voltage signal on line 52 which controls the frequency of voltage controlled oscillator 53. The output of oscillator 53 on line 54 is a continuous wave (CW) signal centered at frequency F1 plus F2. Power divider 55 divides the signal on line 54 to produce two identical in phase output signals on lines 56 and 57. The signal on line 56 is applied to the image reject circuit shown generally as circuit 68, which generates a signal on line 50 that is offset in frequency by F1 hertz from the frequency of the signal on line 56.

The image reject circuits 68 which offsets the input signal on line 56 by the frequency F1 employs the principal of phase cancellation. The input frequency on lines 56, 59 and 60 is at a frequency F1 plus F2. The input frequency to the mixers 61 and 62 is shown having a frequency F1 Since the F1 frequencies are 90° out of phase from each other and the F1 and F2 signals are in phase with each other, the product produced at the output of quadrature hybrid circuit 65 causes the cancellation of the F1 frequency and produces an F2 frequency on line 50 which is applied to the phase detector or comparator 48. The signal on line 31 modulates the signal on line 60 using mixer 61 to produce a modulated output signal on line 63. Likewise the signal on line 24A modulates the signal on line 59 employing mixer 62 to produce a modulated output signal on line 64. The signals on line 63 and 64 are applied to the quadrature hybrid circuit 65 to produce separate output signals on lines 50 and 66 which are the sum and difference components. The lower image frequency F2 is produced on output line 50. The upper image frequency on line 66 is not employed in this embodiment and is therefore terminated into a 50 ohm terminating resistor 67.

The mixer 69 is shown having an F2 input and an input shown as F1 plus F2 on line 57. The sum and different products of these frequencies appear on line 70 and the upper image product is filtered out in filter 71 to produce an F1 frequency on line 72 which is further enhanced by an optional zero crossing detector hard limiter thus producing an extremely accurate square wave output at frequency F1 having ultra-low phase noise associated therewith. Further, the square wave signal output on line 74 that is in phase with the average phase of the noisy input signal on line 22.

Having explained a preferred embodiment of the present invention wide deviation tracking filter it will be appreciated that the square wave output pulses on line 74 have very little phase noise associated therewith. Further, oscillators 43 and 53 were selected for having very low phase noise compared to oscillators of the type required and are used in the low frequency phase-locked loop such as oscillator 28. Typical relative phase noise results will be shown and explained in FIG. 4. The phase noise improvement is the difference between the phase noise of loop 21 compared to the phase noise of loop 20. Since both phase-locked loops 20 and 21 must track the frequency of the input signal on line 22, the phase noise of loops 20 and 21 are nearly identical for their low frequency offsets.

Figure 4:
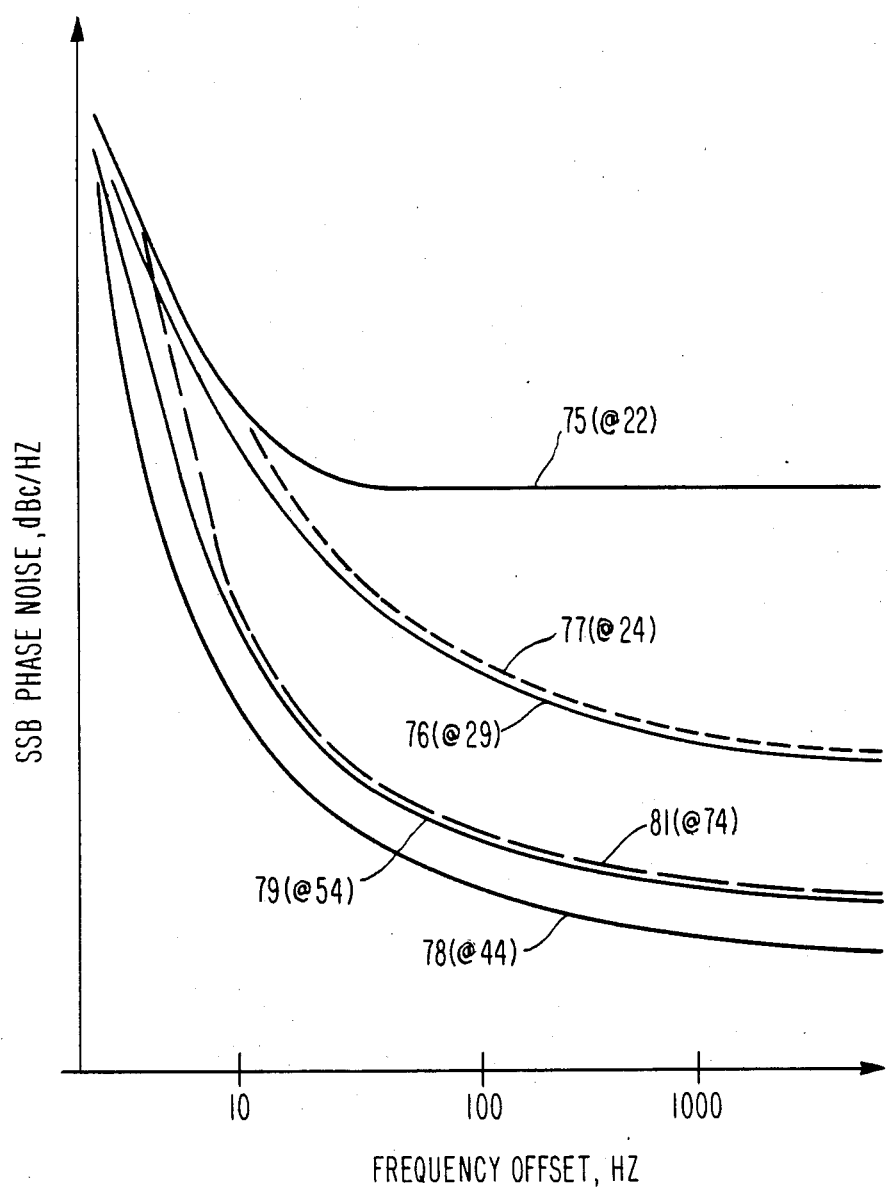
FIG. 4 is a typical phase noise diagram showing the improvement obtained by the novel tracking circuit.

Refer now to FIG. 4 showing typical phase noise improvement versus offset frequency. The phase noise is shown as a typical representation for single side band phase noise in decibel carrier (dBc) per hertz units. The frequency offset, which is the frequency difference or offset from the center frequency F1 is in hertz units. Waveform 75 shows the phase noise versus frequency for the signal on line 22 at the input. As the frequency offset of the signal on line 75 increases it becomes substantially horizontal due to thermal noise. The phase noise versus frequency offset signal at the output of VCO 28 on line 29 is shown as curve 76 and the signal at the output of the low frequency phase-locked loop 20 on line 24 is shown as curve 77. The phase noise associated with the signal on line 44 from oscillator 43 is shown as curve 78 and the phase noise associated with the signal on line 54 from the voltage controlled oscillator 53 is shown as curve 79. The phase noise versus frequency offset at the output of the high frequency phase-locked loop, at the output of tracking filter 21 on line 74, is shown as curve 81. It can be seen that the curve 81 has less phase noise versus frequency offset than either curve 75 or 77, thus showing in incremental stages the improvement accomplished by the low frequency phase-locked loop 20 and the high frequency phase-locked loop 21. It will be appreciated that the frequency offset scale is a logrithmic scale in hertz and that the design loop bandwidth for the phase-locked loops 20 and 21 are only approximately 20 hertz.

For purposes of this invention the improved phase noise is achieved only when the bandwidth ratios are greater than approximately two to one which causes curves 77 and 81 to be clearly separated.

What is claimed is:

1. A wide deviation tracking filter, comprising:
   input signal means having at least one stable well defined waveform edge,
   a low frequency phase-locked loop coupled to said input signal means having a voltage controlled oscillator which is driven at twice the input signal frequency,
   said input signal means having a bandwidth greater than two,
   a wide frequency range digital phase shifter coupled to said low frequency phase-locked loop for producing a pair of quadrature clock signals at the input signal frequency,
   a high frequency phase-locked loop having a high frequency stable oscillator input and an ultra-low phase noise signal output having the same phase and frequency as the input signal,
   image rejection means connected in series in said high frequency phase-locked loop at the output of the loop voltage controlled oscillator,
   said image rejection means having a pair of mixers coupled to said quadrature clock signals from said digital phase shifter and a quadrature hybrid circuit coupled to the output of said mixers for producing a noisy replica of said stable oscillator input signal that is applied to the phase detector of the high frequency phase-locked loop for producing a tracking error signal which is applied to said loop voltage controlled oscillator.

2. A wide deviation tracking filter as set in forth in claim 1 wherein said digital phase shifter is connected in series in said low frequency phase-locked loop and comprises a D-type flip flop having its clock input connected to the output of the low frequency phase-locked loop voltage controlled oscillator having a frequency at twice the input signal frequency.

3. A wide deviation tracking filter as set forth in claim 2 which further includes an exclusive OR circuit in the signal path of said pair of quadrature clock signal outputs.

4. A wide deviation tracking filter as set forth in claim 2 which further includes a delay gate connected in series in each of the pair of quadrature clock output signal paths from said D-type flip flop.

5. A wide deviation tracking filter as set forth in claim 1 wherein said stable oscillator and said loop voltage controlled oscillator in said high frequency phase-locked loop are both low phase noise oscillators.

6. A wide deviation tracking filter as set forth in claim 5 wherein said low phase noise oscillators are crystal oscillators operating at or near 10 megahertz.

7. A wide deviation tracking filter as set forth in the claim 1 wherein said high frequency phase-locked loop comprises a first power divider, coupled to the output of said loop voltage control oscillator.

8. A wide deviation tracking filter as set forth in claim 7 wherein said image rejection means in said high frequency phase-locked loop comprises a second power divider having a pair of in phase outputs coupled to said mixers.

9. A wide deviation tracking filter as set forth in claim 8 wherein said image rejection means comprises a quadrature hybrid circuit coupled to the outputs of said mixers and to the input of the phase detector of said high frequency phase-locked loop.

* * * * *